(12) United States Patent
Kamada

(10) Patent No.: US 9,553,245 B2
(45) Date of Patent: Jan. 24, 2017

(54) LIGHT EMITTING DEVICE

(71) Applicant: NICHIA CORPORATION, Anan-shi, Tokushima (JP)

(72) Inventor: Kazuhiro Kamada, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/757,448

(22) Filed: Dec. 23, 2015

(65) Prior Publication Data
US 2016/0190408 A1    Jun. 30, 2016

(30) Foreign Application Priority Data
Dec. 24, 2014    (JP) .................................. 2014-260496

(51) Int. Cl.
| | |
|---|---|
| *H01L 33/00* | (2010.01) |
| *H01L 21/00* | (2006.01) |
| *H01L 33/54* | (2010.01) |
| *H01L 33/62* | (2010.01) |
| *H01L 33/60* | (2010.01) |

(52) U.S. Cl.
CPC ............... *H01L 33/54* (2013.01); *H01L 33/60* (2013.01); *H01L 33/62* (2013.01)

(58) Field of Classification Search
CPC ..................................................... H01L 33/54
USPC ............................ 438/29, 30; 257/98–9, 139
See application file for complete search history.

(56) References Cited

U.S. PATENT DOCUMENTS

| | | | | |
|---|---|---|---|---|
| 7,728,343 B2 * | 6/2010 | Fujino | ..................... | H01L 33/60 257/100 |
| 7,767,475 B2 * | 8/2010 | Masui | ................... | H01L 33/507 257/98 |
| 7,800,124 B2 * | 9/2010 | Urano | ................... | H01L 33/483 257/98 |
| 8,167,456 B2 * | 5/2012 | Sanpei | ................. | H05K 1/0203 362/249.02 |
| 2008/0179617 A1 | 7/2008 | Kadotani et al. | | |
| 2009/0141492 A1 | 6/2009 | Fujino et al. | | |

FOREIGN PATENT DOCUMENTS

| | | |
|---|---|---|
| JP | 2007-201171 A | 8/2007 |
| JP | 2007-243225 A | 9/2007 |
| JP | 2007-243226 A | 9/2007 |
| JP | 2008-199000 A | 8/2008 |
| JP | 2008-258296 A | 10/2008 |
| JP | 2011-066267 A | 3/2011 |
| JP | 2012-059921 A | 3/2012 |
| JP | 2012-124358 A | 6/2012 |
| JP | 2014-146685 A | 8/2014 |

* cited by examiner

*Primary Examiner* — Calvin Lee
(74) *Attorney, Agent, or Firm* — Global IP Counselors, LLP

(57) ABSTRACT

A light emitting device includes: a substrate having a base body and a plurality of wiring parts provided on at least one side of the base body; a first covering part that covers part of the wiring parts; a plurality of light emitting elements that are disposed on the wiring parts exposed from the first covering part; a second covering part that is disposed on the first covering part surrounding the light emitting elements and is formed from a material whose reflectivity is higher than that of the first covering part, and a resin component that seals the substrate and the light emitting elements, and is disposed in contact with the first covering part and the second covering part.

14 Claims, 4 Drawing Sheets

LIGHT EMITTING DEVICE

CROSS-REFERENCE TO RELATED APPLICATIONS

This application claims priority to Japanese Patent Application No. 2014-260496 filed on Dec. 24, 2014. The entire disclosure of Japanese Patent Application No. 2014-260496 is hereby incorporated herein by reference.

BACKGROUND

1. Technical Field

The present disclosure relates to a light emitting device.

2. Description of Related Art

Light emitting devices equipped with light emitting elements and the like arranged on a substrate have been proposed in the past. In such light emitting devices, a chip on board (COB) configuration in which a chip-type light emitting element is directly mounted on a printed substrate, a chip on film (COF) configuration in which a thin, flexible film is used instead of a hard printed substrate, a chip-type light emitting element is directly mounted on a flexible substrate, or the like has been employed.

Also, irrespective of the type of the substrate and the mounting, various techniques, such as providing a white resist layer on the surface of the substrate, have been adapted in order to improve the light extracting efficiency of the light emitting element, as described in, for example, JP2008-258296A, JP2007-201171A, and JP2012-59921A.

In the conventional light emitting devices that employ configurations of COB, COF, or the like, a resin may be directly applied on the substrate or the film to enclose the light emitting element, but stronger adhesion of the sealing resin or the like to the substrate or to the electrical elements has been required.

SUMMARY

An object of the present disclosure is to provide a light emitting device in that an improved adhesion among various members that constitute the light emitting device can be ensured.

A light emitting device according to certain embodiments of the present disclosure includes: a substrate having a base body and a plurality of wiring parts provided on at least one side of the base body; a first covering part that covers a portion of the wiring parts; a plurality of light emitting elements that are disposed on the wiring parts exposed from the first covering part; a second covering part that is disposed on the first covering part surrounding the light emitting elements and is formed from a material whose reflectivity is higher than that of the first covering part, and a resin component that seals the substrate and the light emitting elements, and is disposed in contact with the first covering part and the second covering part.

According to the light emitting device of the present disclosure, it is possible to provide a light emitting device with which better adhesion of the various members that constitute the light emitting device can be ensured.

DETAILED DESCRIPTION OF THE EMBODIMENT

Figure 1A:
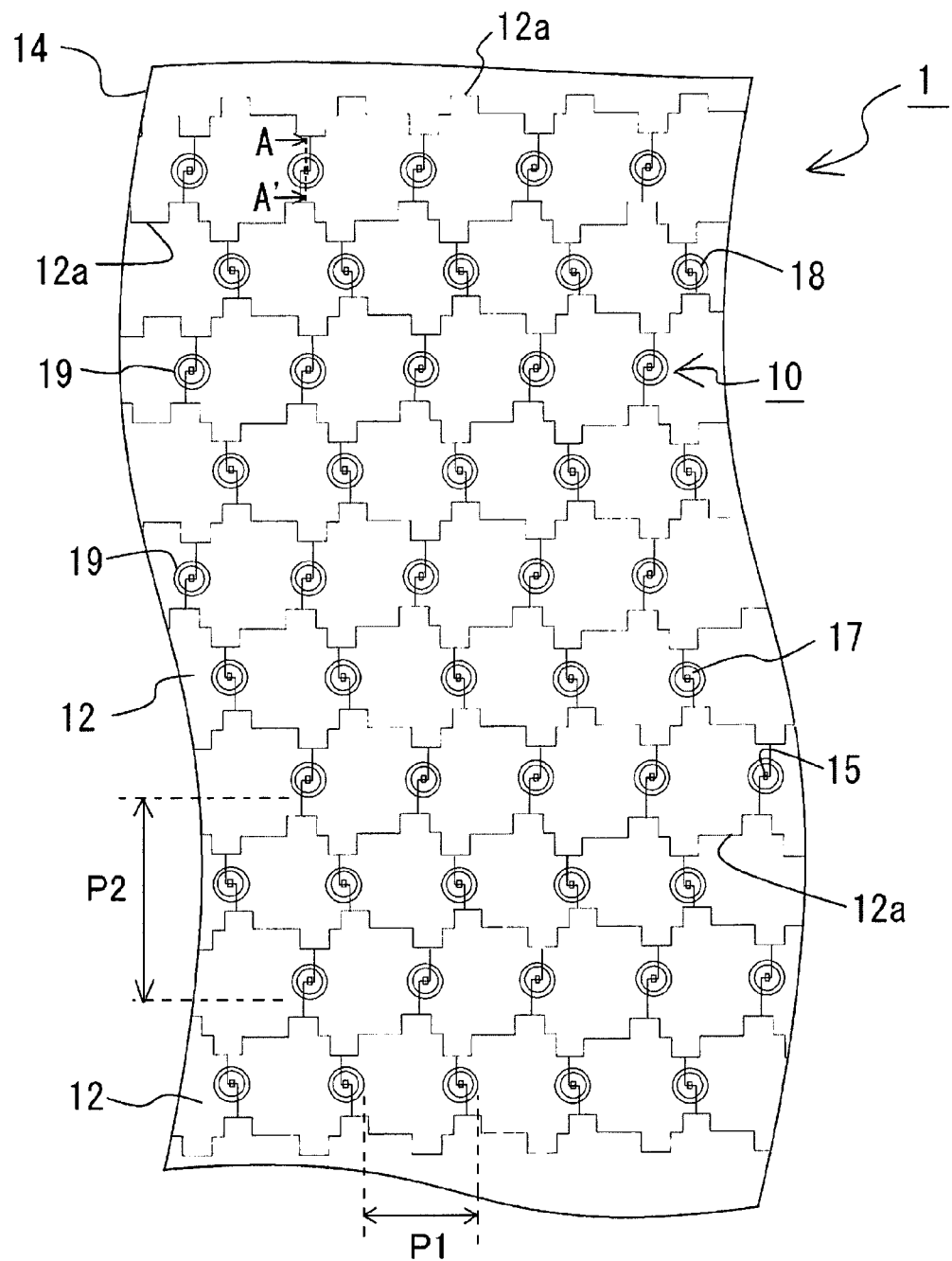
FIG. 1A is a schematic plan view of a light emitting device according to one embodiment of the present disclosure.

Embodiments for implementing the light emitting device of the present invention will be described below with reference to the accompanying drawings. In the following embodiment of the light emitting device that embody the technological concept of the present invention are just examples, and unless otherwise specified, the constituent parts discussed in the embodiments are not intended to limit the scope of the present invention. Further, constitutions described in examples and the embodiments can be employed in other examples and embodiments.

The sizes and the arrangement relationships of the members in each of drawings are occasionally shown exaggerated for ease of explanation.

The inventors conducted diligent research into the reliability of light emitting devices in the configurations of COB, COF, etc., and found that in addition to an improvement in the adhesion of the sealing resin to the substrate or the electrical element, a reduction in the warpage, distortion, and the like of the substrate or the film can realize an improvement in the luminance and a reduction in uneven brightness, and enhance reliability of the light emitting device that leads to a configuration that satisfies those requirements without greatly changing a conventional configuration.

The light emitting device of certain embodiments of the present disclosure mainly includes a substrate, a first covering part, and light emitting elements, and preferably further includes one or more layers and/or parts that cover portions or whole of the substrate and/or the light emitting elements. Examples of this covering part include a second covering part and a resin component.

Substrate

The substrate mainly includes a base body and wiring parts. There is at least a pair of wiring parts for connecting to the positive and negative electrodes of the light emitting elements, and preferably a plurality of wiring parts are provided on the base body.

Base Body

The base body is a member that serves as the matrix of the light emitting device, and can be formed from a suitable material as dictated by the objective, the application, etc. The material can be suitably selected by taking into account the mounting of the light emitting elements, optical reflectivity, adhesion to other members, and so forth. Examples include resin, glass, ceramic, carbon, pulp, dielectrics, composites of these, and other such insulating materials. More specifically, it is preferable to use polyethylene terephthalate, polyimide, or another such resin, or a reinforced plastic molding material in which glass cloth, carbon fiber, or other such fibrous reinforcing material is impregnated with a resin (epoxy resin, silicone resin, these resins that have been modified, etc.) and the resin is cured (that is, glass epoxy, prepreg, or the like). The base body may be a single layer or may have a multilayer structure.

There are no particular restrictions on the thickness of the base body, but it can be about 10 µm to 1 mm, for example. The base body may be flexible, in which case the thickness is about 10 to 300 µm, for example, with 200 µm or less being preferable, and 150 µm or less being more preferable.

The shape (size and length) of the base body can be suitably selected as dictated by the objective, application, and so forth. For example, the shape can be quadrangular, rectangular, polyhedral, circular, elliptical, or a combination of these shapes. In the case of applying the light emitting device according to the embodiments for a straight-tube type lamp or the like, an elongated rectangular shape with a length of at least 10 times greater than the width can be preferably employed. In the case of using a flexible base member, several units of the base member can be processed together using a roll-to-roll method.

Wiring Parts

The wiring parts are conductive members that can be connected to an external power supply. They are disposed on one surface of the base body, and are directly or indirectly connected to the light emitting elements. The wiring part can be formed, for example, from a conductive thin-film made of a single layer or a laminar structure, of copper, aluminum, or another such metal or alloy.

There are no particular restrictions on the thickness of the wiring parts, and the thickness can be the same as that of wiring parts provided to substrates normally used in this field. An example is a range of about 1 µm to 1 mm. In particular, in the case where the flexible base body is used as discussed above, the wiring parts are preferably thin enough not to lose this flexibility, such as about 10 to 150 µm. In the case where the wiring parts are provided to one surface, the interior, and the other surface of the base body, the thickness may vary from one place to another, but is preferably uniform all over. Also, the thickness may vary from place to place on the base body, but is preferably uniform all over.

There are no particular restrictions on the shape (pattern) of the wiring parts, but typically it is the same as the shape or pattern of the wiring on the base body or the like on which the light emitting elements are mounted, or a shape similar to this. The shape is preferably set after taking into account heat dissipation and/or strength and other such factors. Examples include a crank shape, triangular, quadrangular, or another polyhedral shape, circular, elliptical, or another shape with no corners, one of these shapes that is partially irregular, or the like. A combination of two or more of these shapes may also be used.

Preferably, a plurality of wiring parts are disposed so as to be separated from one another. Also, in addition to the wiring parts that are directly or indirectly connected to the light emitting elements (that is, the wiring parts that contribute to conduction), wiring parts that do not contribute to conduction may also be provided in the same or a different shape.

The wiring parts that can contribute to conduction are preferably configured as a positive-side terminal and a negative-side terminal. There are no particular restrictions on the number of wiring parts that make up a pair of terminals. For instance, a pair of terminals may be constituted by just one terminal, or may be constituted by a plurality of terminals.

The wiring parts that can contribute to conduction are preferably connected to a pair of external wiring, for example. This results in power being supplied from the external wiring. Also, the pair of external wiring is preferably connected to a known connector.

The wiring parts that do not contribute to conduction can function as heat dissipation members or light emitting element mounting components. Also, wiring parts that do not contribute to conduction can be used when engraving (also known as lot printing) a bar code or the like on the upper surface of the substrate, for example. In lot printing, the first and second covering parts are removed with a laser or the like to expose the wiring parts, so there is preferably no connection with the external wiring.

Greater latitude in the layout of the light emitting device can be afforded by disposing the wiring parts over a relatively large surface area and combining wiring parts having various shapes. The base body may be substantially square, circular, or elliptical, and a single light emitting element may be connected to ordinary positive and negative wiring parts. Heat dissipation will be good in the case where the wiring parts are provided over as large a surface area as possible on one surface of the base body.

On one side of the base body, a plurality of wiring parts are separated from one another. Thus, on one side of the base body, there is a groove where no wiring parts are provided (that is, a portion where the base body is exposed). Since the groove is disposed in between wiring parts, its shape corresponds to the shape of the wiring parts, an example of which is a crank shape. The width of the groove is preferably less than the width of the wiring parts, or in other words, the wiring parts are preferably provided in a large surface area.

In the case where the wiring parts (including both the wiring parts that contribute and do not contribute to conduction) are disposed in a relatively large surface area on one side of the base body, then even though a flexible base body is used, for example, the desired strength can be added while maintaining this flexibility. Consequently, disconnection of the wiring part caused by bending of the flexible substrate, breakage of the substrate itself, or the like can be effectively prevented. More specifically, the wiring parts are preferably provided over a surface area of at least 50% with respect to the surface area of the base body, with 80% or higher being more preferable, and 90% or higher being still more preferably.

The covering part that covers the wiring parts is preferably able to function as a film that reflects the light emitted from the light emitting elements. The covering part, as will be discussed below, has openings so as to expose the wiring parts, and except for these openings, preferably covers substantially the entire surface of the substrate, and also preferably covers the above-mentioned groove between the wiring.

The wiring parts can be formed by vapor deposition, sputtering, plating, or another such method on one or both sides of the base body. A metal foil may also be applied by pressing. The wiring parts can also be patterned as desired by etching after first masking, using printing, photolithography, or another such method.

The total thickness of the substrate, including the above-mentioned wiring parts, first covering part, and an optional conductive layer and third covering part (discussed below), is preferably 500 µm or less, with 400 µm or less being more preferable, and 300 µm or less being still more preferably.

In particular, in the case where the base body is thinner than 200 μm, the total thickness of the substrate is preferably 400 μm or less, and more preferably 300 μm or less, and in the case where the base body is thinner than 150 μm, the total thickness of the substrate is preferably 300 μm or less, and more preferably 250 μm or less. Adjusting to these ranges allows the thinness of the substrate to be ensured while also reducing stress inside the base body, and makes it possible for warping and distortion of the substrate to be effectively suppressed.

First Covering Part

The first covering part is disposed on the substrate. The first covering part preferably covers all or part of the wiring parts and/or the base body, and it is particularly preferable for part of the wiring parts to be exposed. The first covering part preferably has openings in order to expose the wiring parts corresponding to a positive and negative pair, and the groove that separates this pair of positive and negative wiring parts. There are no particular restrictions on the shape or size of the openings, but they are preferably as small as possible while still allowing the light emitting elements to be electrically connected to the wiring parts. The plurality of openings will vary in their shape and size, but are preferably all the same.

The required number and layout of the light emitting elements is usually adjusted according to the output of the light emitting device, the light distribution, and so forth, so the number and position of the openings can be suitably determined likewise. The openings may be used to connect a single light emitting element to the wiring parts, or may be used to connect two or more light emitting elements to the wiring parts, or they may be a mixture of these. The positions of the openings can be suitably determined as dictated by the design of the light emitting device. For instance, they may be laid out in a regular pattern, such as in a matrix and/or diagonally, or they may be disposed randomly.

The first covering part can be formed, for example, from a thermosetting resin, a thermoplastic resin, or the like. Specific Examples of the resin include an epoxy resin composition; a silicone resin composition; a modified epoxy resin composition such as a silicone modified epoxy resin; a modified silicone resin composition such as an epoxy modified silicone resin; a polyimide resin composition, a modified polyimide resin composition, polyphthalamide (PPA), a polycarbonate resin; a polyphenylene sulfide (PPS); a liquid crystal polymer (LCP); an ABS resin (an acrylonitrile-butadiene-styrene resin); a phenolic resin; an acrylic resin; and a PBT resin (polybutylene terephthalate resin).

The first covering part preferably contains a material that will reflect the light emitted by the light emitting elements, and optionally light of a wavelength converted by a wavelength conversion member. The reflection here is preferably such that the reflectivity with respect to this light is at least 60%, and more preferably at least 65%, and even more preferably at least 70%. Examples of such a material include light reflecting materials, light scattering materials, and so forth. Examples of the light reflective materials include titanium dioxide, silicon dioxide, zinc dioxide, zirconium dioxide, potassium titanate, alumina, aluminum nitride, magnesium oxide, boron nitride, mullite, niobium oxide, and various types of rare earth oxides such as yttrium oxide, gadolinium oxide, etc.). Examples of the light scattering materials include barium sulfate, titanium dioxide, aluminum oxide, silicon oxide and colorants (such as carbon black). The first covering part may also contain glass fiber, wollastonite, or another such fibrous filler, carbon, talc, silicon oxide, or another such inorganic filler, or other additives.

These materials can be contained in an amount of 5 to 50 wt % with respect to the total weight of the first covering part.

The first covering part is preferably relatively thin, and it is particularly preferable for it to be disposed so that the upper surfaces of the light emitting elements are located higher than the covering part(s). Thus setting the thickness allows the first resin (discussed below) to be disposed on the side surfaces of the light emitting elements. As a result, broad light distribution characteristics can be obtained, which is particularly preferable when the device is used for illumination. A range of about 0.5 to 500 μm can be used, for example. In particular, when a flexible base body is used as discussed above, the first covering part is preferably thin enough not to lose this flexibility, such as about 1 to 50 μm.

The first covering part can be formed on one or both sides of the base body by printing, potting, spin coating, transfer molding, dipping, or another such method.

Second Covering Part

The light emitting device preferably has a second covering part as a part that covers part of the substrate.

The second covering part preferably disposed on the first covering part, and more preferably is disposed only on the first covering part. Also, the second covering part is preferably disposed surrounding the light emitting elements. In plan view, the second covering part is preferably disposed on the edges of the light emitting elements, away from the outer edge, and surrounding all or part of the outer edge of the light emitting elements.

The second covering part is preferably disposed as a plurality of islands on the substrate, for example. In this case, the islands constituting the second covering part are preferably separated from one another. The second covering part islands may be separated for each light emitting element, or for each group of a predetermined number of light emitting elements.

Figure 1B:
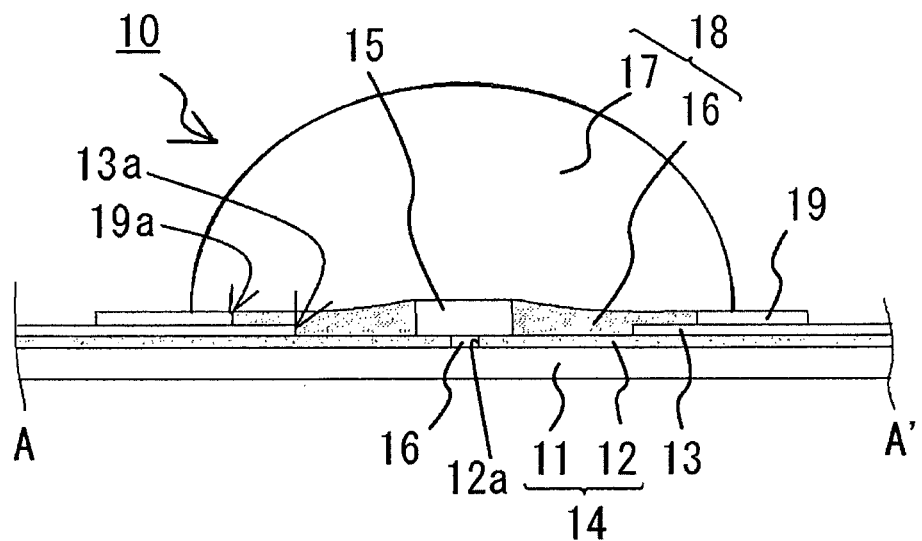
FIG. 1B is a schematic cross sectional view of FIG. 1A.

The second covering part is preferably disposed so that the edge on the light emitting element side (19a in FIG. 1B) is farther away than the edge of the first covering part on the light emitting element side (13a in FIG. 1B). For example, the distance between the edge of the second covering part on the side closer to the light emitting element and the edge of the first covering part on the side closer to the light emitting element is preferably about 0.1 to 0.5 mm. Also, the opening surface area of the second covering part may be about 0.8 to 2.5 times the opening surface area of the first covering part, preferably about 1 to 2 times, and more preferably about 1.3 to 1.6 times.

The second covering part can be formed from any of the materials listed above for the first covering part. That is, the second covering part can be formed from a thermosetting resin, a thermoplastic resin, or the like. Also, these resins preferably contain a light reflecting material and/or a light scattering material and/or a filler or the like. The second covering part preferably has a reflectivity for the above-mentioned light of at least 80%. Also, the reflectivity of the second covering part is preferably greater than the reflectivity of the first covering part. The second covering part contain a light reflecting material and/or a light scattering material and/or a filler or the like in an amount of 5 to 70 wt % with respect to the total weight of the second covering part. However, the second covering part preferably either contains the same materials as the first covering part, or has the same composition. The second covering part preferably has a higher reflectivity than the first covering part. Accordingly, the second covering part preferably contains a light reflecting material with a higher reflectivity and/or contains a larger amount of light reflecting material than the first covering part.

Thus forming the second covering part on the first covering part allows the role of ensuring the insulation of the substrate and thereby protecting the wiring parts to be separated from the role of preventing light emitted from the light emitting elements from being absorbed by the substrate and thereby improving the light extraction efficiency. Consequently, the desired role can be performed at the proper place, and the unintended role can be prevented from being performed at that site. For example, when the material constituting the first covering part and/or the second covering part is taken into account, optical reflection and adhesion to the resin discussed below are mutually exclusive properties, but in the case where these roles are separated by the first covering part and the second covering part, a good balance in the properties can be struck between the two, and the properties of both can be fully realized.

There are no particular restrictions on the thickness of the second covering part, which can be suitably set within the range given for the first covering part. It is especially good in the case where the thickness of the second covering part is the same as the thickness of the first covering part. Alternatively, the thickness of the second covering part can be more preferably adjusted to achieve the desired reflectivity, according to the material that makes up the second covering part, and particularly the type of light reflecting material, the amount contained, and so forth.

The second covering part can be formed by one of the methods listed for the first covering part, on one side of the base body, independently from the first covering part.

Other

The substrate may have a conductive layer disposed on the other surface (back surface) that is on the opposite side from the surface where the light emitting element is mounted or in the interior of the base body. The conductive layer can be formed from one of the materials listed above for the wiring parts. However, the conductive layer may also have a material or composition different from that of the wiring parts.

The conductive layer may have a different thickness from that of the wiring parts, but the thickness is preferably the same. Also, the thickness of the conductive layer may vary with the location on the base body, but is preferably the same all over.

The conductive layer is preferably disposed with slits on the back surface of the base body. The shape and so forth of the slits can be suitably set by taking into account positional offset of the electronic parts in the reflow step during the light emitting device manufacturing process, the exertion of stress on the joining members caused by warping of the substrate after the mounting of electronic parts, and the decrease in the heat dissipation of the substrate. In particular, it is preferable for the slits not to be disposed directly under where the light emitting elements and other such electronic parts are mounted on the substrate surface. It is also preferable for the slits to be disposed in a matrix. The surface area of the slits is about 0.1 to 10 times the total surface area of the wiring grooves on the surface, for example, with about 0.25 to 4 times being preferable, and about 0.5 to 2 times being more preferable. Warping of the substrate can be effectively reduced by having the surface area of the slits in the conductive layer on the substrate surface be closer to that of the wiring grooves on the substrate surface.

A third covering part may be disposed on the back surface of the base body. In the case where a conductive part is formed on the back surface of the base body, the third covering part preferably covers all or substantially all of the conductive layer. The third covering part can be formed by one of the materials listed for the first covering part. However, the third covering part and the first covering part may also be of different materials or compositions. For example, the third covering part may be formed only from a thermosetting resin or a thermoplastic resin.

The third covering part and the first covering part may be of different thickness, but are preferably the same. Also, the thickness of the third covering part may vary with the location on the base body, but is preferably the same all over.

It is particularly preferable for the conductive layer to be formed from the same material and in the same thickness as the wiring parts, and/or for the third covering part to be formed from the same material and in the same thickness as the first covering part.

Thus disposing the conductive layer and/or the third covering part on the base body allows the layer structures on the front and back sides of the base body to be similar, so the stress exerted on the base body can be cancelled out on the front and back sides of the base body. As a result, warping, distortion, and so forth of the substrate can be effectively prevented.

Light Emitting Elements

A plurality of light emitting elements are disposed on the wiring parts exposed from the first covering part. As discussed above, the light emitting elements may be disposed in any way on the wiring parts, according to the shape, size, and so forth of the openings that expose the covering part. However, the pair of positive and negative electrodes of a light emitting element is disposed so as to be electrically connected to a pair of wiring parts. Consequently, a pair of wiring parts serves as an anode and a cathode.

The number of light emitting elements disposed on the wiring and/or their color and/or their layout is determined so as to satisfy the light distribution characteristics and output required for the light emitting device. Therefore, the shape, position, and so forth of the wiring parts and/or the openings in the first covering part, etc., are adjusted accordingly, as discussed above.

The light emitting element has a semiconductor structure, a p-side electrode, and an n-side electrode.

The semiconductor structure can be formed, for example, by a p-type layer, an active layer, and an n-type layer composed of a gallium nitride semiconductor or a group II-IV or III-V semiconductor, laminated successively on a light-transmissive sapphire substrate.

The n-side and p-side electrodes can be formed by a single-layer film or a laminar film of a known material.

The light emitting element may have a substrate for growing the semiconductor structure, but need not have one.

The light emitting element may be flip-chip mounted on wiring, or may be mounted surface-up.

In the case of flip-chip mounting, the p-side and n-side electrodes of the light emitting element are connected to a pair of wiring parts via a pair of joining members. The joining members can be Sn—Ag—Cu, Sn—Cu, Au—Sn, or another such solder, a bump or like of gold or another such metal, silver, paste, or the like.

In the case of surface-up mounting, the light emitting element is fixed on a base body and/or on wiring parts by the above-mentioned conductive joining member, or by a resin or other such insulating joining member. In the case where the substrate of the light emitting element is conductive, an electrical connection will be made by the above-mentioned joining member.

On one side of the substrate may be provided not only the light emitting elements, but also a Zener diode or other such protective element or related parts. However, these are preferably disposed at a position where they will not absorb light from the light emitting elements, and since protective elements do not need to be provided in the same number as the light emitting elements, a single protective element may be mounted on the wiring parts where a plurality of light emitting elements are serially connected, for example, in which case it is preferably mounted near a connector, etc., regardless of the layout of the light emitting elements.

Resin Component

The light emitting device preferably includes a resin component as a layer that covers all or part of the substrate and/or the light emitting elements. All or part of the resin component may be a single layer or a laminar structure. For instance, the resin component preferably includes an under-fill disposed directly under the light emitting elements and/or to the side of and in contact with the light emitting elements, and a sealing member that seals at least the substrate and the light emitting elements.

The resin component can be formed by potting, transfer molding, printing, spraying, or the like.

Under-Fill

The under-fill mainly refers to a member that is on the substrate and disposed directly under the light emitting elements and/or to the side of and in contact with the light emitting elements. This member may be disposed all the way to the periphery of the light emitting elements. Usually, the mounting of the light emitting elements on the substrate is performed using joining members or the like, and these joining members and/or part of the surface of the substrate (such as the wiring parts), etc., usually have a low optical reflectivity and high optical absorption in the visible light band. Therefore, in the case where these joining members and/or part of the surface of the base body, etc., is covered by under-fill near the light emitting elements, then the joining members and/or the base body, etc., will not be directly irradiated by the light emitted from the light emitting elements. As a result, the absorption of light by the members that make up the light emitting device can be effectively prevented.

The under-fill may be disposed on the wiring part disposed to the outside of the outer edges of the light emitting elements. The under-fill may be disposed without touching the first covering part, or may be disposed on the first covering part, or may be disposed touching the first covering part and the second covering part. In other words, the under-fill may be disposed up to the first covering part that exposes part of the wiring parts, and may also be disposed up to the second covering part disposed surrounding the light emitting elements on the first covering part. It is especially good in the case where the under-fill is disposed on the base body, the wiring parts, and the first covering part, and is disposed so as to touch the side surface (the end surface) of the second covering part. In this case, the under-fill may be disposed on the second covering part, but is preferably not. If the under-fill is disposed all the way to on the second covering part, then the outer edges of the under-fill are preferably disposed on the second covering part. Even when the under-fill is thus disposed, it is preferably disposed by making suitable adjustment so that the absorption of light emitted from the light emitting elements, etc., can be reduced, and reflection can be increased, and furthermore the adhesion of the sealing member (discussed below) can be increased.

To put this another way, the under-fill in plan view may have the same surface area as the light emitting elements, and preferably has a surface area that is about 20 times or less. In the case where the under-fill is thus disposed over a large surface area, as will be discussed below, its contact surface area with the sealing member increases, so adhesion between the two results in even stronger adhesion of the sealing member of the light emitting device.

The under-fill is preferably disposed for each of a predetermined number of light emitting elements, which each under-fill separated from the others. It is particularly favorable for it to be disposed for each light emitting element, and separated from the other under-fill.

The under-fill can be formed from the material that makes up the above-mentioned first covering part. That is, the under-fill can be formed from a thermosetting resin, a thermoplastic resin, or the like, for example. In particular, the resin used for the under-fill preferably includes the same resin as the sealing member (discussed below), or is made up of the same resin. These resins may contain a light reflecting material and/or a light scattering material and/or additives and/or a phosphor or the like (discussed below). Containing a light reflecting material is particularly preferred.

The under-fill contain a light reflecting material and/or a light scattering material and/or additives and/or a phosphor or the like in an amount of 1 to 40 wt % with respect to the total weight of the under-fill. However, when adhesion to the light emitting elements, the wiring parts of the substrate, the first covering part and/or the second covering part is taken into account, the under-fill preferably has optical reflectivity that is the same as or less than the second covering part, such as having the same or lower content of the light reflecting material as in the second covering part. Also, the under-fill preferably has a higher optical reflectivity than the first covering part, such as containing more light reflecting material than the first covering part.

Sealing Member

The sealing member is preferably formed on the substrate so as to cover the light emitting elements entirely. The material of the sealing member can be the same as those materials listed for the under-fill above. It is particularly preferable for it to be formed from a light transmissive material. The term light transmissive here means that the material transmits at least about 60% of the light emitted by the light emitting elements, and preferably at least 70%, and more preferably at least 80%. The sealing member may be of a different material and composition from those of the under-fill, or may be of the same material and composition, but preferably includes the same material. In particular, the sealing member preferably includes the same resin as the under-fill. This results in good compatibility, miscibility, and mutual solubility between the sealing member and the under-fill at the site where they come into contact, so even better adhesion can be ensured between the two, and stronger adhesion of the sealing member in the light emitting device can be achieved.

The sealing member may also contain fluorescent materials. The fluorescent materials can be contained in an amount of about 5 to 50 wt % with respect to the total weight of the sealing member.

Examples of the fluorescent materials include;

fluoride complex fluorescent materials activated with manganese such as $A_2MF_6$:Mn, (A is at least one of Li, Na, K, Rb, Cs and $NH_4$; M is at least one of Ge, Si, Sn, Ti and Zr), i.e., $K_2SiF_6$:Mn(KSF), KSNAF($K_2Si_{1-x}Na_xAl_xF_6$:Mn) and $K_2TiF_6$:Mn(KTF);

nitride-based and oxynitride-based fluorescent materials activated mainly with lanthanoid elements such as cerium, europium, and more specifically, α or β-sialon phosphor activated with europium;

various alkaline earth metal nitride silicate fluorescent materials;

alkaline earth metal halogen apatite fluorescent materials, alkaline earth metal halo-silicate fluorescent materials, alkaline earth metal silicate fluorescent materials, alkaline earth metal borate halogen fluorescent materials, an alkaline earth metal aluminate fluorescent materials, alkaline earth metal silicates, alkaline earth metal sulfides, alkaline earth metal thiogallate, alkaline earth metal silicon nitride, germanate salt fluorescent materials, which are activated mainly by lanthanoid elements such as europium, transition metal-based elements such as manganese;

rare earth aluminates, rare earth silicate, which are activated mainly with lanthanoid elements such as cerium;

organic and organic complexes, which are activated mainly with lanthanoid element such as europium. Among these, YAG fluorescent material activated by cerium, LAG fluorescent material activated by cerium are preferred.

The sealing member may be formed on the under-fill. That is, the sealing member may be in contact with only the under-fill, in addition to the light emitting elements. Also, the sealing member may be in contact with only the under-fill and the second covering part, in addition to the light emitting elements. Furthermore, the sealing member may be in contact with the under-fill, the second covering part, and the first covering part, in addition to the light emitting elements. In any case, the sealing member allows the sealing of the substrate and the light emitting elements to be more securely affixed by means of contact not only with the second covering part, but also with the under-fill and/or the first covering part.

As long as it covers the light emitting elements, the sealing member may be in any shape, but when directionality of the light emitted from the light emitting elements is taken into account, the sealing member is preferably in the form of a concave or convex lens. A hemispherical convex lens is particularly preferable. Examples of the plan view shape include circular, elliptical, triangular, quadrangular, and other such polyhedral shapes, but various shapes are possible. A circular or elliptical shape is preferable. The sealing members are preferably disposed separated from each other, for each of the desired number of light emitting elements, and it is particularly favorable for them to be disposed separated from each other for each single light emitting element.

For example, the size of the sealing member in plan view can be suitably adjusted by taking into account the brightness, directionality, and so forth of the light emitting device. It is particularly preferable for the sealing member to be large enough to increase the contact surface area with the under-fill and/or the first covering part. In the case where the flexible substrate is used, the sealing member may be of a size that does not compromise the flexibility of the substrate. For example, it may be at least large enough to cover all of the light emitting elements, and have a diameter or length that is no more than about 4 to 10 times the length of one side of the light emitting elements, and more preferably no more than 6 times. More specifically, one side (diameter) measures about 1 to 6 mm.

From another standpoint, the outer edge of the sealing member is preferably disposed on the second covering part. This allows the light headed in the substrate direction (out of the light emitted from the light emitting elements, or reflected light) to be reflected upward more efficiently by the second covering part, and improves the light extraction efficiency.

Therefore, on the outside of the sealing member, the upper surface of the second covering part is preferably exposed from the sealing member. Also, on the outside of the sealing member, the upper surface of the first covering part is preferably exposed from the second covering part. Furthermore, on the outside of the sealing member, the upper surface of the second covering part is preferably exposed from the sealing member, and the upper surface of the first covering part is exposed from the second covering part.

Thus disposing the under-fill, the first covering part, and/or the second covering part directly under the sealing member allows a good fit with these to be ensured, so the sealing of the substrate and/or the light emitting elements can be stronger and more secure, and good reliability can be ensured in the light emitting device.

Embodiments of the light emitting device of the present invention will now be described through reference to the drawings.

Embodiment 1

Figure 1C:
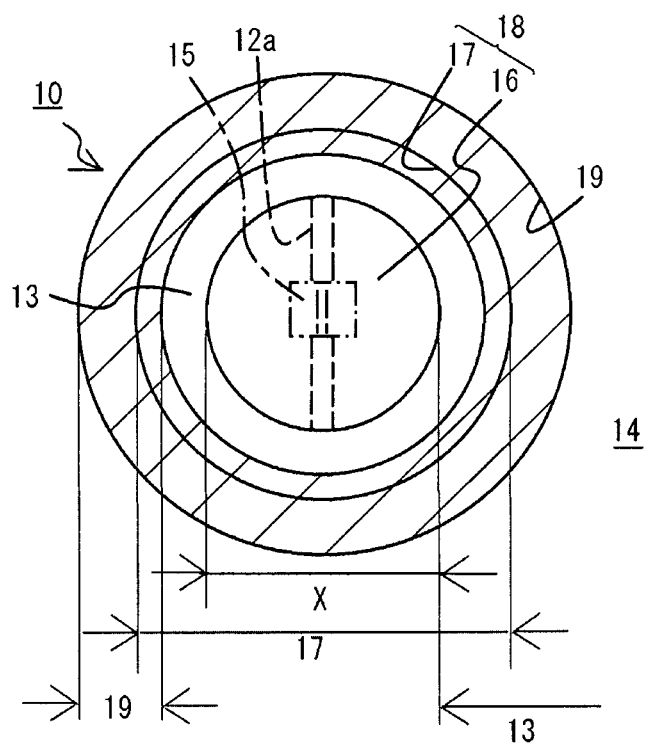
FIG. 1C is an enlarged see-through plan view of FIG. 1B.

As shown in FIGS. 1A to 1C, the sheet-form light emitting device 1 mainly has a substrate 14, a plurality of light emitting elements 15 disposed on the substrate 14, and a resin component 18 that seals the light emitting elements 15. That is, as shown in FIG. 1B, the individual light emitting devices 10 included in the sheet-form light emitting device 1 each have a substrate 14, a plurality of light emitting elements 15 disposed on the substrate 14, and a resin component 18 that seals the light emitting elements 15.

The substrate 14 includes a base body 11 and a plurality of wiring parts 12 provided on the surface of the base body 11. The light emitting device 10 includes a first covering part 13 that covers these wiring parts 12 and exposes part of the wiring parts 12. An opening X that exposes part of the wiring parts 12 in the first covering part 13 is circular and has a diameter of 1.7 mm.

The base body 11 is formed from glass epoxy in a thickness of 110 μm.

The wiring parts 12 are formed from copper film in a thickness of 35 μm. The wiring parts 12 are formed on substantially the entire surface of the base body 11 other than the outer peripheral portion of the base body 11 and at grooves 12a, and pairs of wiring parts are disposed separated from each other via the grooves 12a.

The first covering part 13 is 18 μm thick, and is composed of an acrylic resin that contains talc, silica, and titanium oxide. The total content of talc, silica, and titanium oxide here is 38 wt % with respect to the total weight of the first covering part 13. The first covering part 13 has a plurality of openings (1.7 mm in diameter) arranged in a matrix, through which are exposed the regions where the light emitting elements 15 are mounted and the wiring parts 12 nearby. For example, the pitch of the openings is about 57.4 mm and about 38.3 mm in the column and row direction, respectively (P2 and P1 in FIG. 1A).

The light emitting elements 15 have a semiconductor structure, a p-side electrode, and an n-side electrode (not shown). The p-type semiconductor layer and the light emitting layer are removed from part of the area of the semiconductor structure, the n-type semiconductor layer is exposed, and the n-side electrode is formed on the exposed surface thereof. The p-side electrode is formed on the upper surface of the p-type semiconductor layer. Therefore, the n-side electrode and the p-side electrode are formed on the same surface side with respect to the semiconductor structure. The light emitting elements 15 are electrically connected to a pair of wiring parts 12 exposed from the first covering part 13 of the substrate 14, by joining members, with the surface on which the n-side electrode and the p-side electrode are formed facing down.

The light emitting elements 15 are, for example, square in plan view, measuring 0.6×0.6 mm.

Second covering parts 19 are disposed surrounding the light emitting elements 15 on the first covering part 13. That is, in plan view, the edges of the second covering parts 19 are disposed away from the outer edges of the light emitting elements. Here, a plurality of doughnut-shaped second covering parts 19 are disposed, separated from each other, for each single light emitting element. Also, the second covering parts 19 are disposed so that their edge on the light emitting element 15 side is farther from the light emitting element 15 than the edge of the first covering part 13.

For example, the distance between the edge of a second covering part 19 on the light emitting element side and the edge on the opposite side from the light emitting element is about 3.9 mm. The distance from the edge of the first covering part 13 on the light emitting element side is about 0.55 mm.

The second covering parts 19 are formed from a material with a higher reflectivity than the first covering part 13. More specifically, they are composed of an acrylic resin that contains silica and titanium oxide. The titanium oxide content here is 32 wt % with respect to the total weight of the second covering parts 19.

The second covering parts 19 are approximate 18 μm thick. This thickness allows the desired reflectivity to be attained.

An under-fill 16 is disposed on the surface of the substrate 14, under the light emitting elements 15. The under-fill 16 is also disposed around the region where the light emitting elements 15 are disposed, and covers the side surfaces of the light emitting elements 15. The under-fill 16 also covers the surface of the wiring parts 12 exposed from the first covering part 13, and is in contact with the side surfaces of the second covering parts 19 on the light emitting element 15 side. An under-fill 16 is disposed separated from the others for each light emitting element 15.

The thickness of the under-fill 16 on the light emitting element 15 side is substantially the same as the height of the light emitting elements 15, gradually decreases toward on the first covering part 13, and is substantially equal to the thickness of the second covering parts 19 on the first covering part 13.

The under-fill 16 is composed of a silicone resin that contains titanium dioxide. The titanium dioxide content here is 30 wt % with respect to the total weight of the under-fill 16.

Because the surface of the joining members and the wiring parts 12, the interfaces between them, and so forth are thus covered by the under-fill 16, the absorption of light at these locations can be effectively prevented. Also, the absorption of light by the substrate 14 around the light emitting elements 15 can be prevented, and light extraction efficiency can be improved even further.

The substrate 14 and the light emitting elements 15 are sealed by a sealing member 17 that constitutes the resin component 18. The sealing member 17 is disposed in contact with the under-fill 16 and the second covering part 19. The outer edges of the sealing members 17 are disposed on the second covering parts 19, and thus the sealing members 17 are disposed for the individual light emitting elements 15, away from the other sealing members 17.

The sealing members 17 can be formed from a silicone resin containing a phosphor (LAG, SCASN, β-SiAlON, CASN, YAG) in an amount of about 10 wt %, by potting or the like, in a hemispherical shape with a diameter of about 3.4 mm.

Thus, the sealing members 17 are disposed in contact with the second covering parts 19, which have high optical reflectivity, in addition to covering the light emitting elements 15, but since the majority thereof are in contact with the under-fill 16, which fits very snugly against the sealing member 17, a good fit of the sealing member 17 can be ensured. Also, since the under-fill 16 is in contact with not only the wiring parts 12, but also on a relatively large surface area with the first covering part 13, which fits very snugly against the under-fill, a good fit of the under-fill 16 to the substrate 14 can also be ensured. As a result, peeling of the sealing member 17 from the substrate can be effectively prevented.

In particular, in the case where two or more of the first covering part 13, the second covering parts 19, the under-fill 16, and the sealing member 17 are formed containing the same kind of resin, stronger adhesion can be obtained because of the good compatibility, miscibility, and mutual solubility of these.

Furthermore, since the second covering parts 19, which have high optical reflectivity, can be disposed on an extremely small surface area on the substrate 14, the load of stress on the substrate 14 caused by the expansion/contraction of the second covering parts 19 and so forth can be reduced to a minimum, and warping and distortion of the base body 11 can be prevented.

Embodiment 2

Figure 2A:
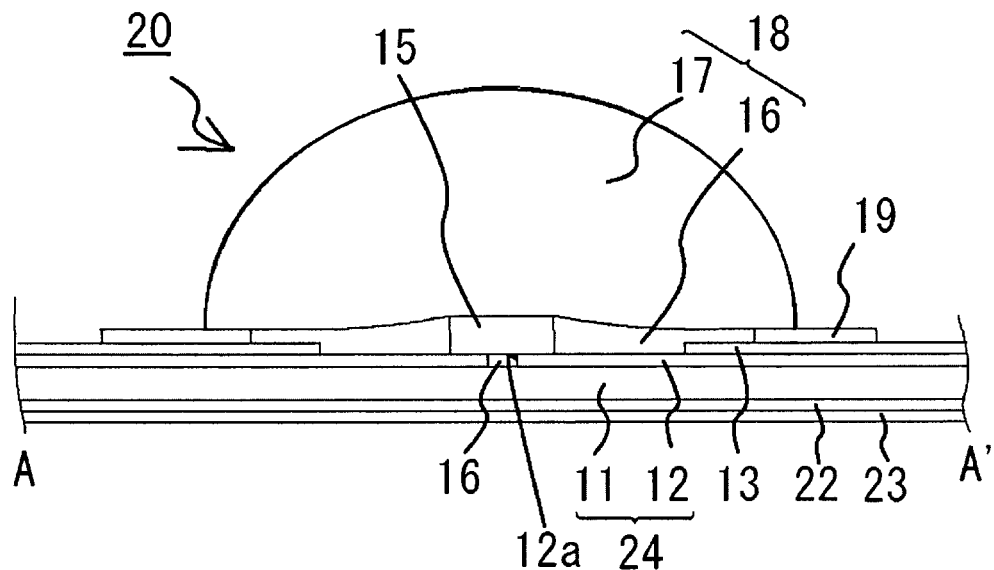
FIG. 2A is a schematic cross sectional view of a light emitting device according to another embodiment of the present disclosure.
Figure 2B:
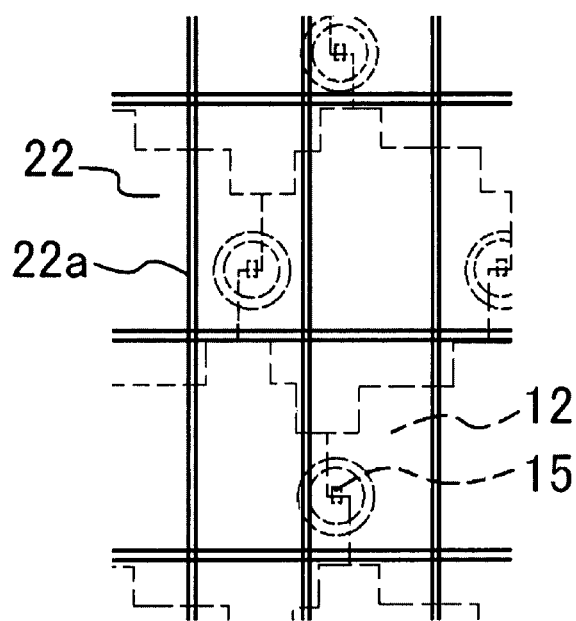
FIG. 2B is a schematic see-through view of the back surface side of the light emitting device in FIG. 2A.

As shown in FIGS. 2A and 2B, for example, the light emitting device 20 in this Embodiment 2 is configured substantially the same as the light emitting devices 10, except that a conductive layer 22 and a third covering part 23 are further disposed, in that order, on the back surface of the substrate 14 of the light emitting devices 10, resulting in a substrate 24 with a five-layer structure.

The conductive layer 22 is formed in the same thickness and from the same material as the wiring parts 12. The third covering part 23 is formed in the same thickness and from the same material as the first covering part 13. FIG. 2B shows the position of slits 22a in the conductive layer 22 on the back surface of the substrate 14 when looking through the light emitting elements 15, the wiring parts 12, and so forth on the surface of the substrate 14.

Using this substrate 24 reduces the internal stress of the substrate 24 itself even though the second covering parts 19, the light emitting elements 15, and the resin component 18 are formed on the substrate 24, that is, partial application of the second covering part strikes a good balance in the contraction of the first covering part, second covering part, and third covering part on the front and back of the substrate, and further reduces warping and distortion of the substrate. Warping of the substrate can be prevented even more effectively by making the slits 22a in the conductive layer 22 on the back surface. The same effects are obtained with this light emitting device 20 as with the light emitting device 10.

Embodiment 3

Figure 3:
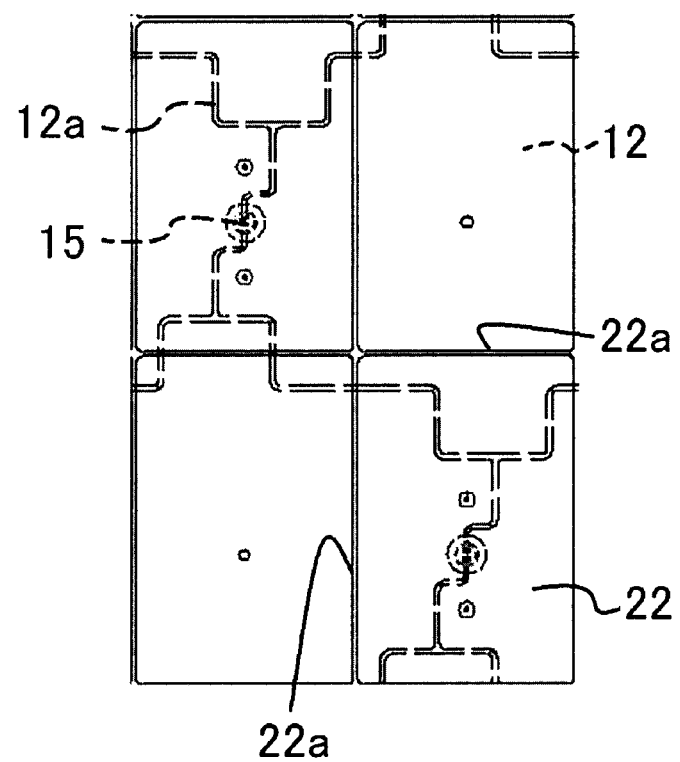
FIG. 3 is a schematic back plan view of a light emitting device according to still another embodiment of the present disclosure.

As shown in FIG. 3, for example, the light emitting device in this Embodiment 3 has substantially the same configuration as the light emitting device in Embodiment 2, except that the pattern of the grooves 12a in the wiring parts 12 on the surface of the substrate 14 is different in the light emitting device 10. Warping of the substrate can be prevented even more effectively by making the slits 22a in the conductive layer 22 on the back surface of the substrate 14.

The same effects are obtained with this light emitting device 20 as with the light emitting device 10.

The light source device of the present disclosure can be used in a variety of light sources, such as a lighting-use light source, various kinds of indicator-use light source, a light source mounted in a vehicle, a display-use light source, a light source for a liquid crystal backlight, sensor-use light source, and signaling devices.

What is claimed is:

1. A light emitting device comprising:
   a substrate having a base body and a plurality of wiring parts provided on at least one side of the base body;
   a first covering part that covers part of the wiring parts;
   a plurality of light emitting elements that are disposed on regions of the wiring parts exposed from the first covering part;
   a second covering part that is disposed on the first covering part surrounding the light emitting elements and is formed from a material whose reflectivity is higher than that of the first covering part; and
   a resin component that seals the substrate and the light emitting elements, and is disposed in contact with the first covering part and the second covering part, the resin component including a first resin portion and a second resin portion, the first resin portion contacting at least a side surface of the light emitting elements, the first covering part, and the second covering part, an upper surface of the light emitting elements being exposed relative to the first resin portion.

2. The light emitting device according to claim 1, wherein the first covering part and the second covering part each contain a light reflecting material, and
   the second covering part contains a larger amount of the light reflecting material than the first covering part.

3. The light emitting device according to claim 1, wherein the second covering part is disposed as a plurality of islands on the substrate.

4. The light emitting device according to claim 1, wherein an outer edge of the resin component is disposed on the second covering part.

5. The light emitting device according to claim 1, wherein a thickness of the second covering part is the same as a thickness of the first covering part.

6. The light emitting device according to claim 1, wherein a total thickness of the substrate is 500 μm or less.

7. The light emitting device according to claim 1, wherein the resin component is separated into a plurality of sections respectively corresponding to the light emitting elements, and
   on an outside of each of the sections of the resin component, an upper surface of the second covering part is exposed from a corresponding one of the sections of the resin component, and an upper surface of the first covering part is exposed from the second covering part.

8. The light emitting device according to claim 1, wherein the light emitting elements are mounted on the regions of the wiring parts by flip-chip mounting.

9. The light emitting device according to claim 1, wherein the light emitting elements are disposed so as to extend over a groove between the wiring parts.

10. The light emitting device according to claim 1, wherein
    the first resin portion that covers the side surface of the light emitting elements has optical reflectivity.

11. The light emitting device according to claim 1, wherein
    the base body has a conductive layer on a surface that is an opposite side from a surface where the light emitting elements are mounted, and a third covering part that covers the conductive layer.

12. The light emitting device according to claim 11, wherein
    the conductive layer is formed from the same material and in the same thickness as the wiring parts, and
    the third covering part is formed from the same material and in the same thickness as the first covering part.

13. The light emitting device according to claim 1, wherein
    a total thickness of the substrate is 200 μm or less.

14. The light emitting device according to claim 13, wherein
    an edge of the second covering part facing a corresponding one of the light emitting elements is disposed farther away from the corresponding one of the light emitting elements than an edge of the first covering part facing the corresponding one of the light emitting element side.

* * * * *